United States Patent
Guo et al.

(10) Patent No.: US 10,512,157 B2
(45) Date of Patent: Dec. 17, 2019

(54) ELECTRONIC DEVICES HAVING AMBIENT LIGHT SENSORS WITH ELECTROSTATIC SHIELDS

(71) Applicant: Apple Inc., Cupertino, CA (US)

(72) Inventors: Dianbo Guo, San Jose, CA (US); Dong Zheng, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 107 days.

(21) Appl. No.: 15/713,378

(22) Filed: Sep. 22, 2017

(65) Prior Publication Data

US 2019/0098748 A1    Mar. 28, 2019

(51) Int. Cl.
| | | |
|---|---|---|
| *H05K 1/02* | (2006.01) | |
| *H05B 37/02* | (2006.01) | |
| *G06F 1/16* | (2006.01) | |
| *H05K 9/00* | (2006.01) | |
| *G09G 3/20* | (2006.01) | |
| *G06F 3/044* | (2006.01) | |
| *G06F 3/041* | (2006.01) | |

(52) U.S. Cl.
CPC ......... *H05K 1/0259* (2013.01); *G06F 1/1601* (2013.01); *G06F 3/044* (2013.01); *G09G 3/2007* (2013.01); *H05B 37/0218* (2013.01); *H05K 9/0079* (2013.01); *G06F 3/041* (2013.01); *G06F 2203/04107* (2013.01); *G09G 2330/06* (2013.01); *G09G 2360/144* (2013.01); *H05K 1/028* (2013.01); *H05K 2201/10151* (2013.01)

(58) Field of Classification Search
CPC ......... H05B 37/0218; G09G 2360/144; G09G 2330/06; G09G 3/2007; H05K 9/0079; H05K 1/0259; H05K 1/028; H05K 2201/10151; G06F 1/1601; G06F 3/044; G06F 2203/04107
See application file for complete search history.

(56) References Cited

U.S. PATENT DOCUMENTS

| | | |
|---|---|---|
| 8,912,480 B2 | 12/2014 | Pope et al. |
| 9,024,250 B2 | 5/2015 | Spraggs et al. |
| 9,671,660 B2 | 6/2017 | Drolet et al. |
| 9,748,635 B2 | 8/2017 | Dabov |
| 2010/0045642 A1 | 2/2010 | Satoh et al. |
| 2014/0133174 A1* | 5/2014 | Franklin ............... H05K 9/0067 362/606 |

* cited by examiner

*Primary Examiner* — Muhammad N Edun
(74) *Attorney, Agent, or Firm* — Treyz Law Group, P.C.; G. Victor Treyz; Kendall W. Abbasi

(57) ABSTRACT

An electronic device may be provided with a display. An opaque layer may be formed on an inner surface of a display cover layer in an inactive area of the display. An optical component window may be formed from the opening and may be aligned with an ambient light sensor such as a color ambient light sensor. The color ambient light sensor may have photodetectors on a light detector integrated circuit. Electrostatic shielding may be incorporated into the color ambient light sensor to prevent perturbations in the output of the color ambient light sensor due to the presence of electrostatic charge in the vicinity of the optical component window. The shielding may include a grounded shield layer on a surface of an ambient light sensor support structure that faces the display cover layer and may include a transparent shield layer overlapping the photodetectors.

20 Claims, 7 Drawing Sheets

ELECTRONIC DEVICES HAVING AMBIENT LIGHT SENSORS WITH ELECTROSTATIC SHIELDS

FIELD

This relates generally to electronic devices, and, more particularly, to electronic devices with optical components such as ambient light sensors.

BACKGROUND

Electronic devices such as laptop computers, cellular telephones, and other equipment are sometimes provided with optical components. For example, an electronic device may have an ambient light sensor for gathering measurements of ambient light levels. Ambient light information may be used in adjusting screen brightness during operation of an electronic device. If ambient light levels brighten, for example, display brightness can be increased to ensure that content is not obscured on a user's display.

Sensors such as ambient light sensors can be adversely affected by electrostatic charge when a user touches an electronic device near to the sensors. If care is not taken, signal perturbations from the presence of a user's finger can create noise in an ambient light sensor output signal. This can lead to undesired fluctuations in screen brightness.

SUMMARY

An electronic device may be provided with a display mounted in a housing. The display may have an array of pixels that form an active area and may have an inactive area that runs along an edge of the active area. An opaque layer may be formed on an inner surface of a display cover layer in the inactive area of the display or may be formed on another transparent layer in the electronic device. An optical component window may be formed from the opening and may be aligned with an ambient light sensor such as a color ambient light sensor. The color ambient light sensor may have photodetectors on a light detector integrated circuit.

Electrostatic shielding may be incorporated into a color ambient light sensor to prevent perturbations in the output of the color ambient light sensor due to the presence of electrostatic charge in the vicinity of the optical component window. The shielding may include a shield layer on a surface of an ambient light sensor support structure that faces the display cover layer and may include a transparent shield layer overlapping the photodetectors.

DETAILED DESCRIPTION

Figure 1:
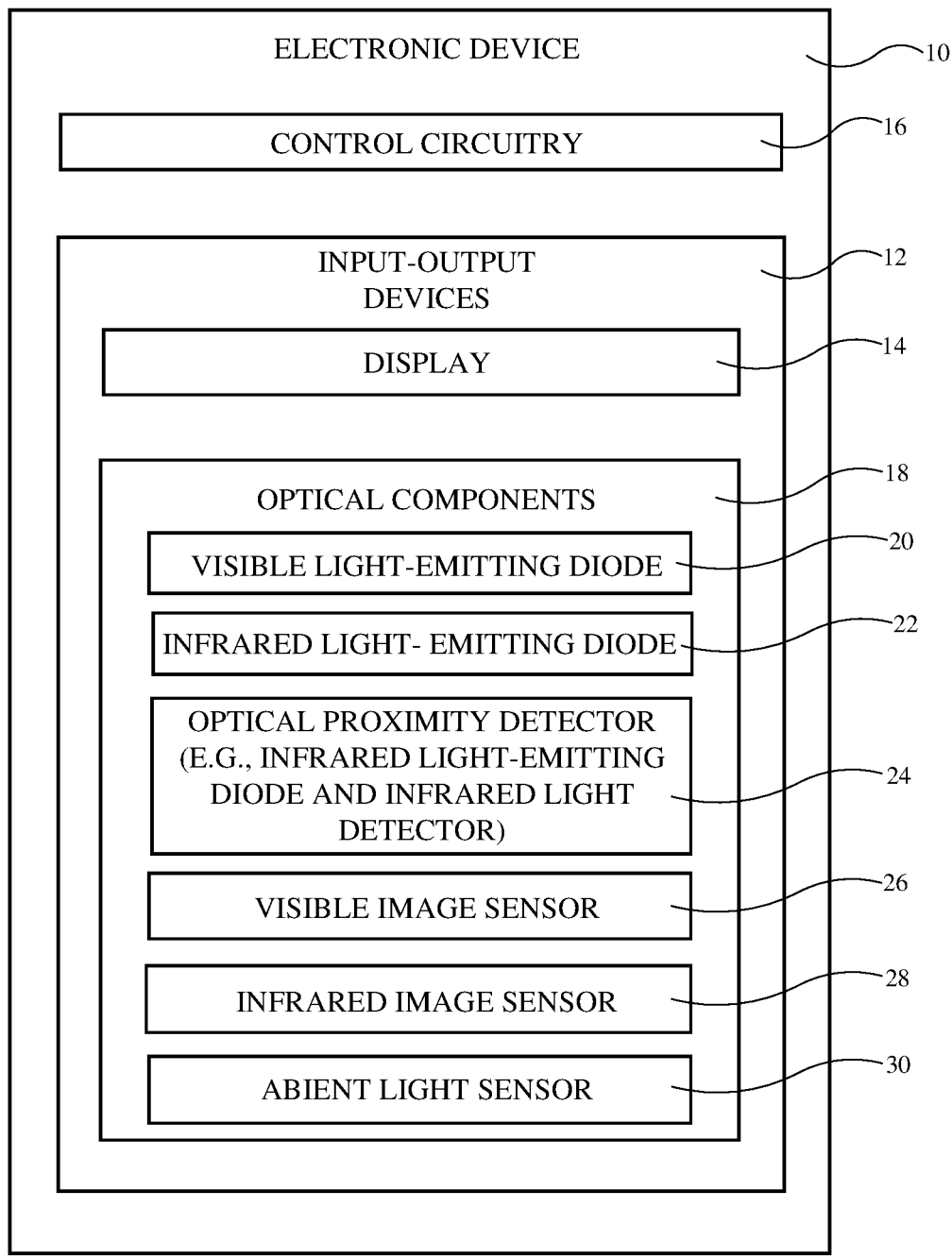
FIG. 1 is a schematic diagram of an illustrative electronic device in accordance with an embodiment.

A schematic diagram of an illustrative electronic device of the type that may be provided with an optical component such as an ambient light sensor is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Device 10 may have input-output circuitry such as input-output devices 12. Input-output devices 12 may include user input devices that gather user input and output components that provide a user with output. Devices 12 may also include communications circuitry that receives data for device 10 and that supplies data from device 10 to external devices. Devices 12 may also include sensors that gather information from the environment.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. Display 14 may be a liquid crystal display, a light-emitting diode display (e.g., an organic light-emitting diode display), an electrophoretic display, or other display.

Input-output devices 12 may include optical components 18. Optical components 18 may include light-emitting diodes and other light sources. As an example, optical components 18 may include one or more visible light-emitting diodes such as light-emitting diode 20. Light-emitting diode 20 may provide constant illumination (e.g., to implement a flashlight function for device 10) and/or may emit pulses of flash illumination for a visible light camera such as visible light image sensor 26. Optical components 18 may also include an infrared light source (e.g., a laser, lamp, light-emitting diode, etc.) such as infrared light-emitting diode 22. Infrared light-emitting diode 22 may provide constant and/or pulsed illumination at an infrared wavelength such as 940 nm, a wavelength in the range of 800-1100 nm, etc. For example, infrared-light-emitting diode 22 may provide constant illumination for an infrared camera such as infrared image sensor 28. Infrared image sensor 28 may, as an example, be configured to capture iris scan information from the eyes of a user and/or may be used to capture images for a facial recognition process implemented on control circuitry 16.

Optical components 18 may also include optical proximity detector 24 and ambient light sensor 30.

Optical proximity detector 24 may include an infrared light source such as an infrared light-emitting diode and a corresponding light detector such as an infrared photodetector for detecting when an external object that is illuminated by infrared light from the light-emitting diode is in the vicinity of device 10.

Ambient light sensor 30 may be a monochrome ambient light sensor that measures the intensity of ambient light or may be a color ambient light sensor that measures ambient light color and intensity by making light measurements with multiple photodetectors each of which is provided with a corresponding color filter (e.g., a corresponding bandpass filter that passes red light, blue light, yellow light, green light, or light of other colors) and each of which therefore responds to ambient light in a different wavelength band.

In addition to optical components 18, input-output devices 12 may include buttons, joysticks, scrolling wheels, touch pads, key pads, keyboards, microphones, speakers, tone generators, vibrators, cameras, light-emitting diodes and other status indicators, non-optical sensors (e.g., temperature sensors, microphones, capacitive touch sensors, force sensors, gas sensors, pressure sensors, sensors that monitor device orientation and motion such as inertial measurement units formed from accelerometers, compasses, and/or gyroscopes), data ports, etc. A user can control the operation of device 10 by supplying commands through input-output devices 12 and may receive status information and other output from device 10 using the output resources of input-output devices 12.

Figure 2:
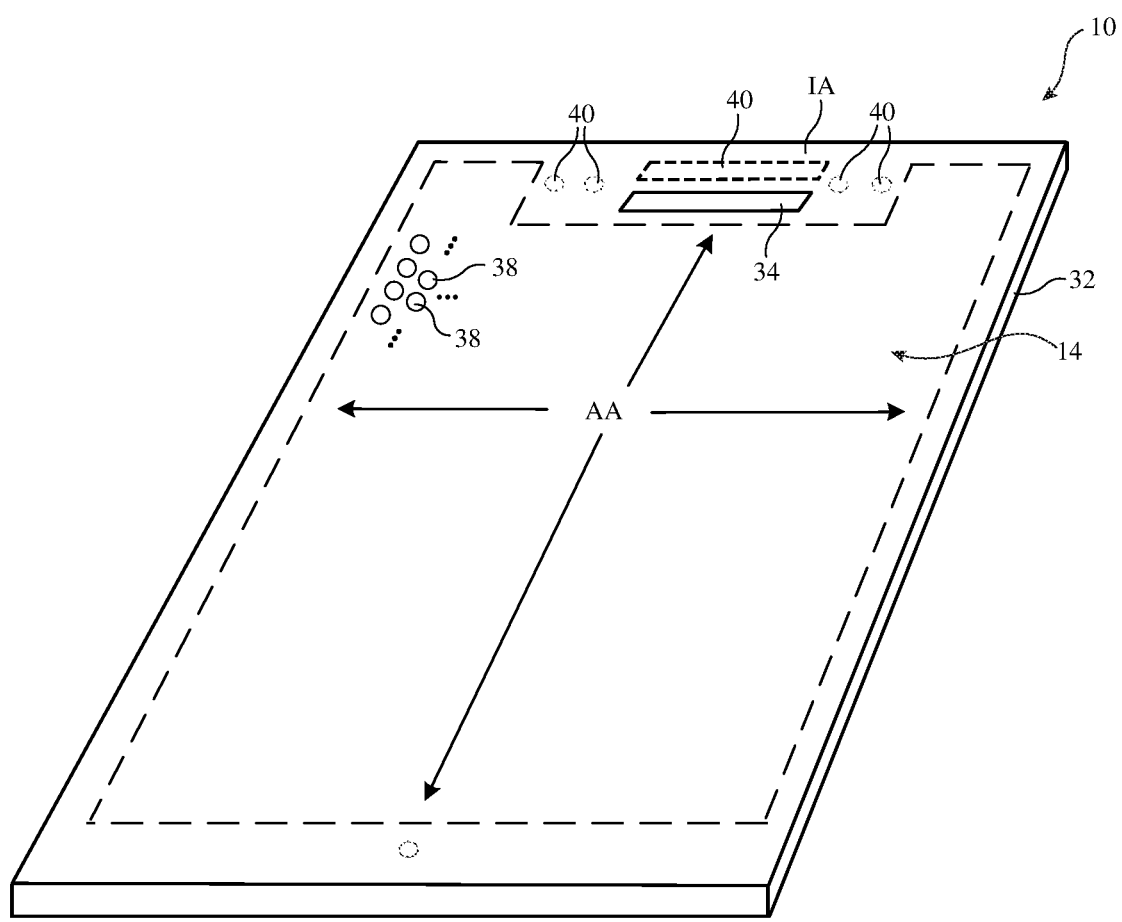
FIG. 2 is a perspective view of an illustrative electronic device with a display having optical component windows overlapping optical components such as an ambient light sensor in accordance with an embodiment.

Device 10 may have a housing. The housing may form a laptop computer enclosure, an enclosure for a wristwatch, a cellular telephone enclosure, a tablet computer enclosure, or other suitable device enclosure. A perspective view of a portion of an illustrative electronic device is shown in FIG. 2. In the example of FIG. 2, device 10 includes a display such as display 14 mounted in housing 32. Housing 32, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 32 may be formed using a unibody configuration in which some or all of housing 32 is machined or molded as a single structure or may be formed using multiple structures (e.g., an internal frame structure, one or more structures that form exterior housing surfaces, etc.). Housing 32 may have any suitable shape. In the example of FIG. 2, housing 32 has a rectangular outline (footprint when viewed from above) and has four peripheral edges (e.g., opposing upper and lower edges and opposing left and right edges). Sidewalls may run along the periphery of housing 32.

Display 14 may be protected using a display cover layer such as a layer of transparent glass, clear plastic, sapphire, or other clear layer (e.g., a transparent planar member that forms some or all of a front face of device 10 or that is mounted in other portions of device 10). Openings may be formed in the display cover layer. For example, an opening may be formed in the display cover layer to accommodate a button, a speaker port such as speaker port 34, or other components. Openings may be formed in housing 32 to form communications ports (e.g., an audio jack port, a digital data port, etc.), to form openings for buttons, etc. In some configurations, housing 32 may have a rear housing wall formed from a planar glass member or other transparent layer (e.g., a planar member formed on a rear face of device 10 opposing a front face of device 10 that includes a display cover layer).

Display 14 may have an array of pixels 38 in active area AA (e.g., liquid crystal display pixels, organic light-emitting diode pixels, electrophoretic display pixels, etc.). Pixels 38 of active area AA may display images for a user of device 10. Active area AA may be rectangular, may have notches along one or more of its edges, may be circular, may be oval, may be rectangular with rounded corners, and/or may have other suitable shapes.

Inactive portions of display 14 such as inactive border area IA may be formed along one or more edges of active area AA. Inactive border area IA may overlap circuits, signal lines, and other structures that do not emit light for forming images. To hide inactive circuitry and other components in border area IA from view by a user of device 10, the underside of the outermost layer of display 14 (e.g., the display cover layer or other display layer) may be coated with an opaque masking material such as a layer of black ink (e.g., polymer containing black dye and/or black pigment, opaque materials of other colors, etc.) and/or other layers (e.g., metal, dielectric, semiconductor, etc.). Opaque masking materials such as these may also be formed on an inner surface of a planar rear housing wall formed from glass, ceramic, polymer, crystalline transparent materials such as sapphire, or other transparent material.

In the example of FIG. 2, speaker port 34 is formed from an elongated opening (e.g., a strip-shaped opening) that extends along a dimension parallel to the upper peripheral edge of housing 32. A speaker may be mounted within device housing 32 in alignment with the opening for speaker port 34. During operation of device 10, speaker port 34 serves as an ear speaker port for a user of device 10 (e.g., a user may place opening 34 adjacent to the user's ear during telephone calls).

Optical components 18 (e.g., a visible digital image sensor, an infrared digital image sensor, a light-based proximity sensor, an ambient light sensor, visible and/or infrared light-emitting diodes that provide constant and/or pulsed illumination, etc.) may be mounted under one or more optical component windows such as optical component windows 40. In the example of FIG. 2, four of windows 40 have circular outlines (e.g., circular footprints when viewed from above) and one of windows 40 has an elongated strip-shaped opening (e.g., an elongated strip-shaped footprint when viewed from above). The elongated window 40 is mounted between the sidewall along the upper peripheral edge of device 10 and speaker port 34 and extends parallel to the upper peripheral edge of housing 32. If desired, windows such as optical windows 40 may have shapes other than circular and rectangular shapes. The examples of FIG. 2 are merely illustrative.

Optical component windows such as windows 40 may be formed in inactive area IA of display 14 (e.g., an inactive border area in a display cover layer such as an inactive display region extending along the upper peripheral edge of housing 32) or may be formed in other portions of device 10 such as portions of a rear housing wall formed from a transparent member coated with opaque masking material, portions of a metal housing wall, polymer wall structures, etc. In the example of FIG. 2, windows 40 are formed adjacent to the upper peripheral edge of housing 32 between speaker port opening 34 in the display cover layer for display 14 and the sidewall along the upper edge of housing 32. In some configurations, an opaque masking layer is formed on the underside of the display cover layer in inactive area IA and optical windows 40 are formed from openings within the opaque masking layer. To help optical windows 40 visually blend with the opaque masking layer, a dark ink layer, a metal layer, a thin-film interference filter formed from a stack of dielectric layers, and/or other structures may be overlap windows 40.

Figure 3:
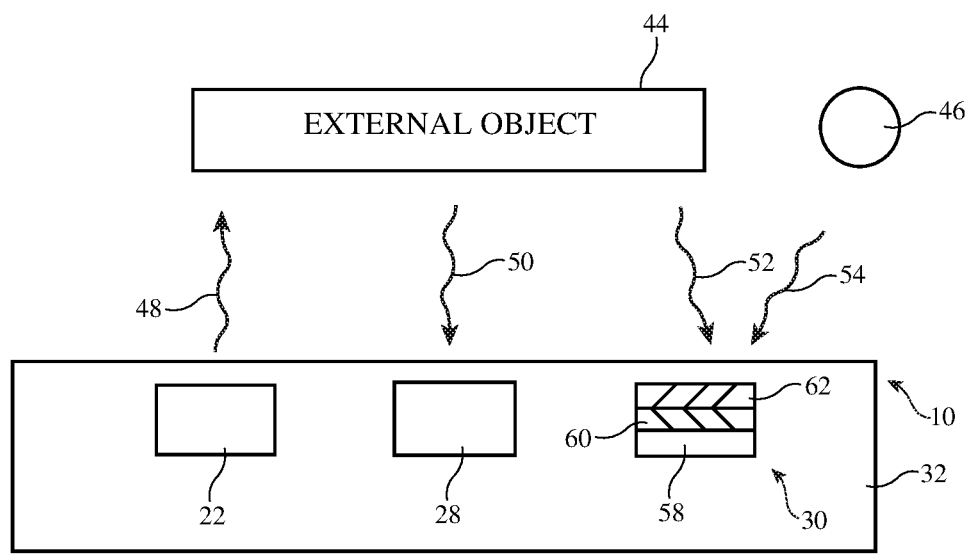
FIG. 3 is a cross-sectional side view of an illustrative electronic device that has optical components such as a light source, image sensor, and ambient light sensor in accordance with an embodiment.

In some modes of operation, device 10 may emit infrared light that has the potential to interfere with ambient light sensor operation. Consider, as an example, a scenario in which control circuitry 16 of device 10 is using infrared image sensor 28 to capture eye scan information and/or facial images (e.g., images of a user's face for use in performing face recognition operations to authenticate the user of device 10). As shown in FIG. 3, to ensure that the eyes and/or face of a user are sufficiently illuminated, device 10 may use infrared light source 22 (e.g., an infrared light-emitting diode, an infrared laser, etc.) to produce infrared light 48. Light 48 may illuminate external objects in the vicinity of device 10 such as external object 44 (e.g., a user's face and/or eyes). Reflected infrared light 50 from external object 44 may be received and imaged using infrared digital image sensor 28 to produce infrared images of the face and/or eyes.

While reflected infrared light 50 is being imaged, stray infrared light reflected from object 44 such as stray infrared light 52 may be present at ambient light sensor 30. To ensure that stray infrared light 52 does not interfere with the ambient light measurements being made with ambient light sensor 30, ambient light sensor 30 may have an infrared blocking filter such as filter 60. Filter 60 may be formed from materials that are transparent to visible light and that block infrared light such as blue glass (e.g., blue borosilicate glass or other infrared-light-blocking glass) and/or from thin-film interference filters formed from stacks of dielectric layers configured to block infrared light (e.g., infrared light at the wavelengths associated with stray light 52 and, if desired, additional infrared wavelengths) while passing visible light.

Ambient light 54 may be present in the surroundings of device 10 and may include light emitted from a light source such as light source 46 (e.g., the sun, a lamp, etc.). In some situations, ambient light 54 may be directional (e.g., the rays of light 54 from light source 46 may be aligned in a particular direction due to the nature of light source 46). To ensure that the response of ambient light detector 30 is even over a range of different orientations relative to light source 46 and ambient light 54, a light diffuser such as diffuser 62 may be incorporated into ambient light sensor 30. Ambient light sensor 30 may have one or more photodetectors (e.g., photodiodes) and associated amplifier and digitizing circuitry implemented on light detector integrated circuit 58. Diffuser 62 may overlap visible-light-transmitting-and-infrared-light-blocking filter layer 60 and integrated circuit 58. Diffuser 62 may be formed from polymer, glass, or other suitable materials.

Figure 4:
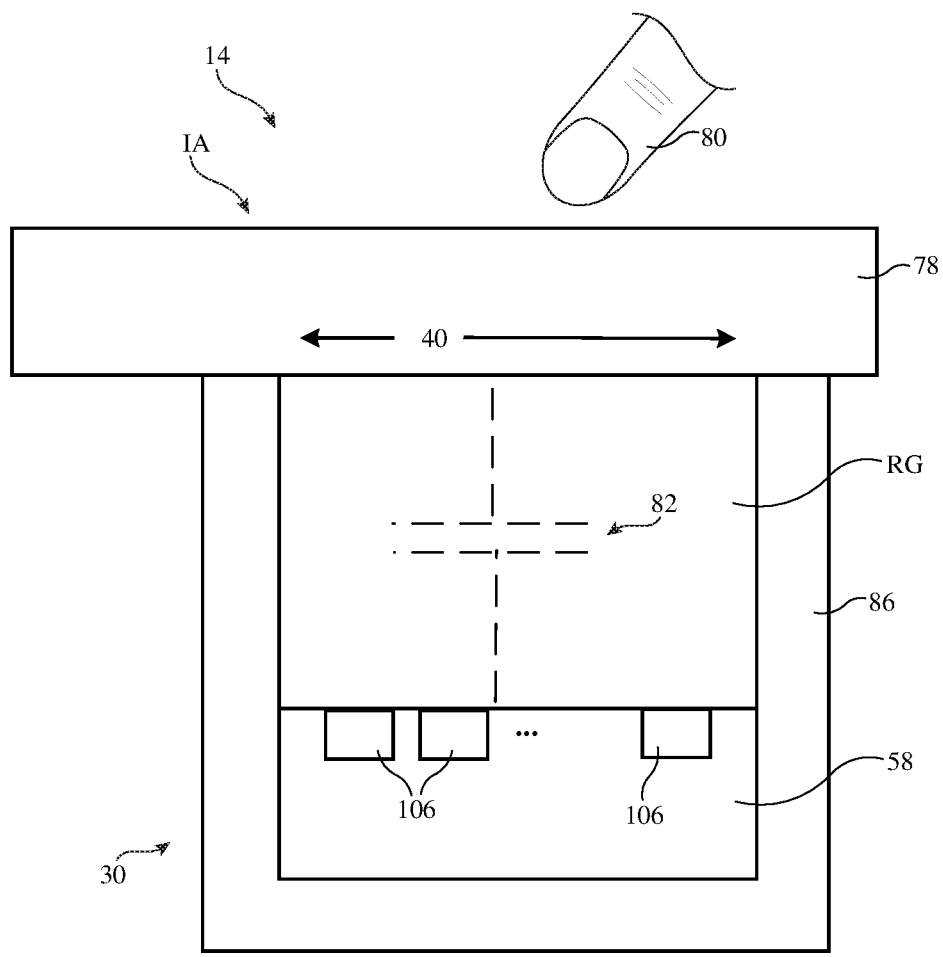
FIG. 4 is a diagram showing how a user's finger may be capacitively coupled to an ambient light sensor integrated circuit through a display cover layer in an electronic device in accordance with an embodiment.

FIG. 4 is a cross-sectional side view of ambient light sensor 30 in an illustrative electronic device 10. As shown in FIG. 4, light detector integrated circuit 58 for ambient light sensor 30 may be mounted in alignment with optical component window 40 under display cover layer 78. Display cover layer 78 may be formed from glass, polymer, ceramic, sapphire, and/or other transparent materials. In active area AA, display cover layer 78 may overlap pixels 38, as shown in FIG. 2. In inactive areas of display 14 such as inactive area IA of FIG. 4, display cover layer 78 and optical component window 40 in layer 78 may overlap ambient light sensor 30.

Ambient light sensor 30 may include light detector integrated circuit 58. Light detector integrated circuit 58 may have one or more photodetectors 106 for making ambient light measurements (e.g., intensity measurements and color measurements). The photodetectors may be associated with different color sensitivities (e.g., a red channel, a blue channel, a green channel, a clear (non-colored) channel, etc.).

Light detector integrated circuit 58 may be supported using support structure 86. Structures RG may be present between the portion of display cover layer 78 that is contacted by user's finger 80 and light detector integrated circuit 58. Structures RG may include light diffusers, light collimators, visible-light-transmitting-and-infrared-light-blocking filters, light guides, lenses, and/or other optical components. These structures may be formed from glass, polymer, ceramic, sapphire and other crystalline materials, and/or other transparent dielectric structures.

Figure 5:
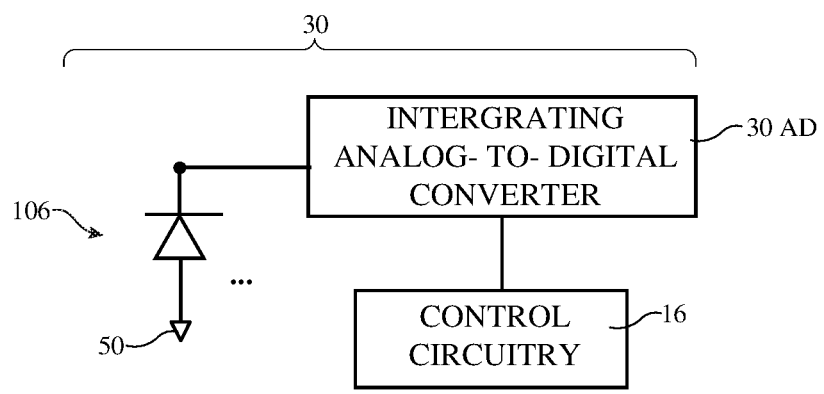
FIG. 5 is a circuit diagram showing how the output signal from a photodetector in a light detector integrated circuit may be perturbed due to capacitive coupling from a user's finger in an electronic device in accordance with an embodiment.

FIG. 5 is a circuit diagram of an illustrative ambient light sensor. As shown in FIG. 5, ambient light sensor 30 may include integrating analog-to-digital converter 30AD for converting analog output signals from photodetectors 106 into digital signals for control circuitry 16. The signals produced by photodetectors 106 on their outputs (see, e.g., node N) are provided to corresponding inputs of integrating analog-to-digital converter 30AD. During operation, the sensor output signals can be perturbed when a user's finger 80 or other external object contacts display cover layer 78 in the vicinity of ambient light sensor 30. When, for example, a user's finger 80 overlaps or is adjacent to optical component window 40, user's finger 80 may be capacitively coupled to light detector integrated circuit and photodetectors 106 via parasitic capacitance 82 (FIG. 4). The user's finger may carry electrostatic charge. The presence of finger 80 can therefore perturb the signals on photodetectors 106, which can lead to noise in the signals measured using ambient light sensor 30.

To prevent noise from being generated when finger 80 is present, ambient light sensor 30 (and, if desired, other optical components 18) can be provided with electrostatic shielding. Shielding may be provided on support structures 86, on light detector integrated circuit 58, and/or other portions of ambient light sensor 30. The shielding may be shorted to a fixed potential such as a ground potential, which helps block signal perturbations on node(s) N due to the presence of user's finger 80. It may be desirable to use ground potential as the fixed potential for the shielding in some configurations as ground potential may be accessible with the system and may have less impact to the system than other fixed potentials.

Figure 6:
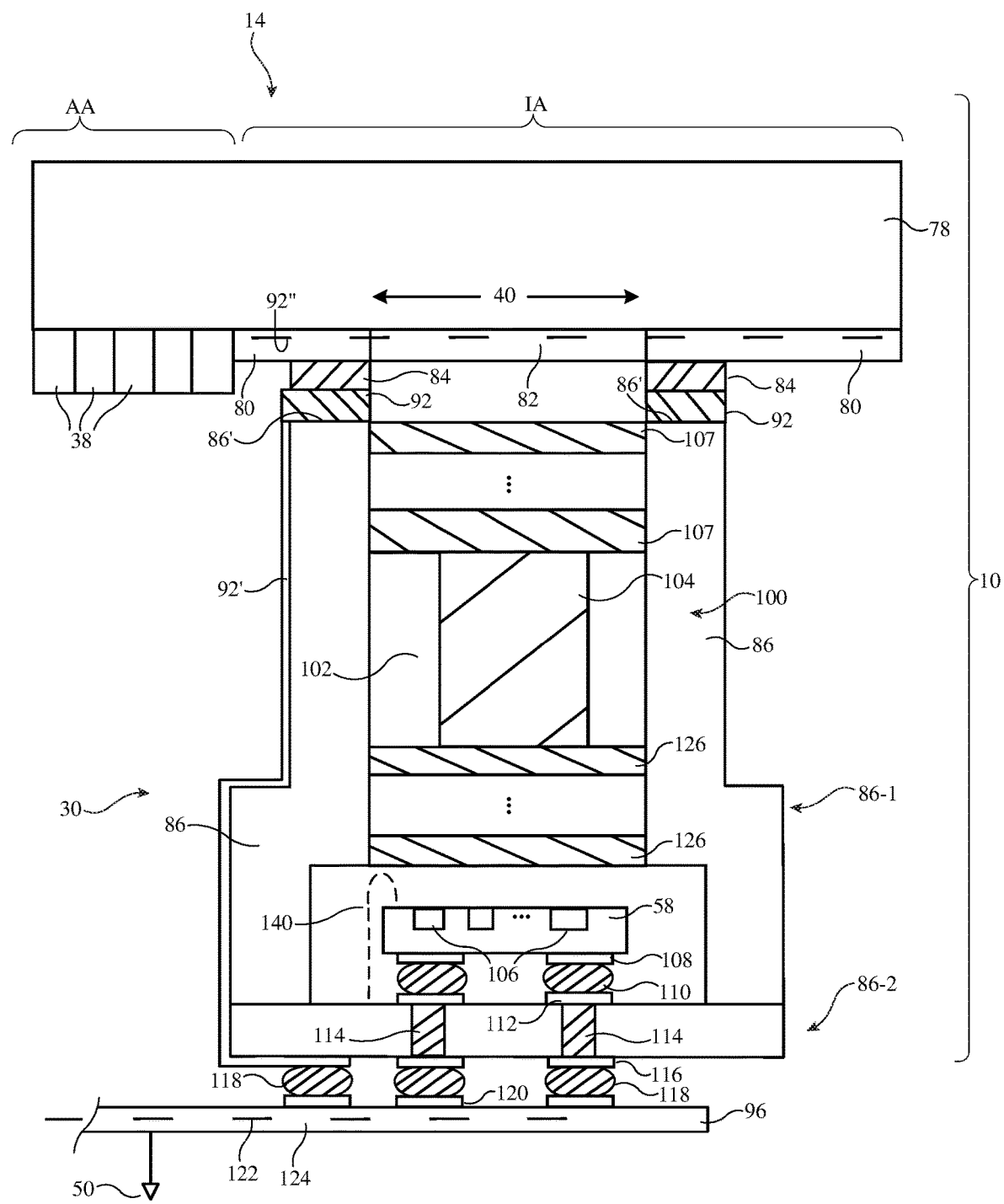
FIG. 6 is a side view of an illustrative ambient light sensor with shielding in accordance with an embodiment.

FIG. 6 is a cross-sectional side view of an illustrative ambient light sensor of the type that may incorporate shielding. In the example of FIG. 6, ambient light sensor 30 is formed in alignment with optical component window 40 (sometimes referred to as an ambient light sensor window) in display 14. Ambient light sensor 30 may be a color ambient light sensor having multiple channels each of which has a respective photodetector 106 configured to measure light in a different range of wavelengths (e.g., a different color). Using these photodetectors, ambient light sensors 30 can make color and intensity measurements on ambient light in the vicinity of device 10.

Display 14 has an array of pixels 38 overlapped by display cover layer 78 in an active area (AA) of display 14. In inactive area IA, portions of the underside of display cover layer 78 may be coated with a layer of opaque masking material 80 (e.g., black ink, etc.) to block internal components from view from the exterior of device 10. Window 40 may be formed from an opening in the opaque masking material 80. In window 40, a thin layer of black ink 82 or other material that is at least partially transparent to visible light (e.g., a layer with a light transmission of at least 1%, at least 2%, at least 5%, 1-10%, less than 30%, etc.) may be present to help visually match the appearance of window 40 to the visual appearance of surrounding portions of display cover layer 78 (e.g., to match the appearance of opaque masking material 80) while still allowing ambient light sensor 30 to measure ambient light.

Color ambient light sensor 30 may include support structures such as support structure 86 (sometimes referred to as a sensor wall, a sensor body structure, a sensor housing structure, etc.). Clear adhesive such as a layer of pressure sensitive adhesive 84 may be used to couple support structure 86 to the underside of display cover layer 78 in alignment with optical component window 40. Adhesive 84 may be transparent and may overlap optical window 40 and/or adhesive 84 may have a ring shape surrounding the periphery of window 40.

Optional light guide 100 may be used to help guide light from optical window 40 at layer 78 to light detector integrated circuit 58. Light guide 100 may include core 104 and cladding 102. Core 104 and cladding 102 may be formed from transparent materials such as glass, polymer, sapphire or other crystalline material, etc. Core 104 may be formed from a material with a higher refractive index than cladding 102 to support light guiding in accordance with the principal of total internal reflection as light passes vertically through light guide 100.

Optional optical layers 107 may be interposed between layer 82 and light guide 100. Optional optical layers 126 may be interposed between light guide 100 and light detector integrated circuit 58. Layers 107 and/or 126 may include light diffuser layers, light collimating layers, visible-light-transparent-and-infrared-light-blocking filter layers, and/or other optical films. As an example, layers 107 may include one or more light diffusers separated by air gaps and may include a light collimating layer. Layers 126 may include one or more visible-light-transmitting-and-infrared-blocking filters. Other configurations may be used for ambient light sensor 30, if desired. The configuration of FIG. 6 is merely illustrative.

As shown in FIG. 6, support structure 86 may form walls that surround layers 107 (e.g., light diffuser layers, etc.), that surround light guide 100, and that surround layers 126 (e.g., visible-light-transmitting-and-infrared-light-blocking filter layer(s)). Viewed from above through layer 78, support structure 86 may extend around the periphery of optical window 40. Support structure 86 may be formed from an opaque material that blocks visible and infrared light such as black plastic and/or other opaque materials.

Support structure 86 may be used to form a one-piece or a multi-piece housing for sensor 30. In the example of FIG. 6, support structure 86 has an upper portion 86-1 that houses components such as layers 107, optional light guide 100, and lower layers 126 and has a lower portion 86-2 (e.g., a printed circuit, a plastic substrate, etc.). Lower portion 86-2 may support and surround light detector integrated circuit 58.

If desired, lower portion 86-2 may contain vias 114 and other metal traces (see, e.g., contacts 112). Light detector integrated circuit 58 can be mounted to the traces in portion 86-2 using wire bonds such as wire bond 140 or solder joints formed from solder 110. Solder 110 may be used to couple contacts on light detector integrated circuit 58 such as solder pads 108 to corresponding contacts on portion 86-2 such as solder pads 112. Metal traces such as vias 114 and other conductive signal paths in portion 86-2 may be used to couple contacts 112 to respective contacts (solder pads) 116 on the lower surface of portion 86-2. Contacts 116 may, in turn, be soldered to contacts (solder pads) 120 on flexible printed circuit 96. Flexible printed circuit 96 may be formed from metal traces 122 supported by dielectric printed circuit material 124 (e.g., polymer or other suitable dielectric). Metal traces 122 may include signal traces and one or more signal paths that short shielding to a fixed potential (e.g., ground traces that short shielding to a ground potential).

Electrostatic shield 92 may help prevent noise from finger 80 or other external objects from being coupled into photodetectors 106 of light detector integrated circuit 58. Shield 92 may be formed from a metal coating (e.g., copper plated with gold and/or other metals) or other conductive layer on support structures 86. As shown in FIG. 6, for example, shield 92 may be formed from metal on upper end of portion 86-1 (e.g., a metal layer on uppermost surface 86' of portion 86-1). In this location, shield 92 may form a metal ring that runs around the periphery of window 40 (e.g., a shield layer that faces the inner surface of display cover layer 78). Adhesive layer 84 may be interposed between shield 92 and display cover layer 78.

During operation, shield 92 can help shield ambient light sensor 30 from the influence of the user's finger or other external object adjacent to optical window 40. A coupling capacitance between shield 92 and the user's finger is formed that is larger than the coupling capacitance between the user's finger and light detector integrated circuit 58 (which is farther from the user's finger). As a result, static charge on the user's finger will interact mostly with shield 92 and will not interact with photodetector 106 or significantly perturb the signal on node N.

Shield path 92', which may be considered to form part of shield 92 and which may sometimes be referred to as a grounding path or shield signal path, may be formed from some of the same metal layer that is used in forming the portions of shield 92 at the upper surfaces of structure 86 and/or may be formed from other conductive material. Shield path 92' may be shorted to a source of fixed potential such as ground 50 through a solder connection (solder joint 118) that is connected to a fixed potential (e.g., ground) formed from a trace at a fixed potential (e.g., a ground trace at ground) in metal traces 122 of printed circuit 96. If desired, shielding such as shield 92 and path 92' may cover all of the exterior sidewall surfaces of structures 86 and/or may be formed on other structures in ambient light sensor 30 (e.g., interior portions of structure 86, metal embedded in the walls of support structure 86, etc.). Shielding such as shield 92 may be formed from metal paint, metal deposited using physical vapor deposition, metal deposited using chemical vapor deposition, metal deposited using electroplating, and/or conductive material deposited using other techniques. If desired, shield 92 may include or be formed using a layer such as transparent conductive layer 92" on the inner surface of display cover layer 78. Layer 92" may be, for example, a transparent conductive layer such as a layer of indium tin oxide.

Figure 7:
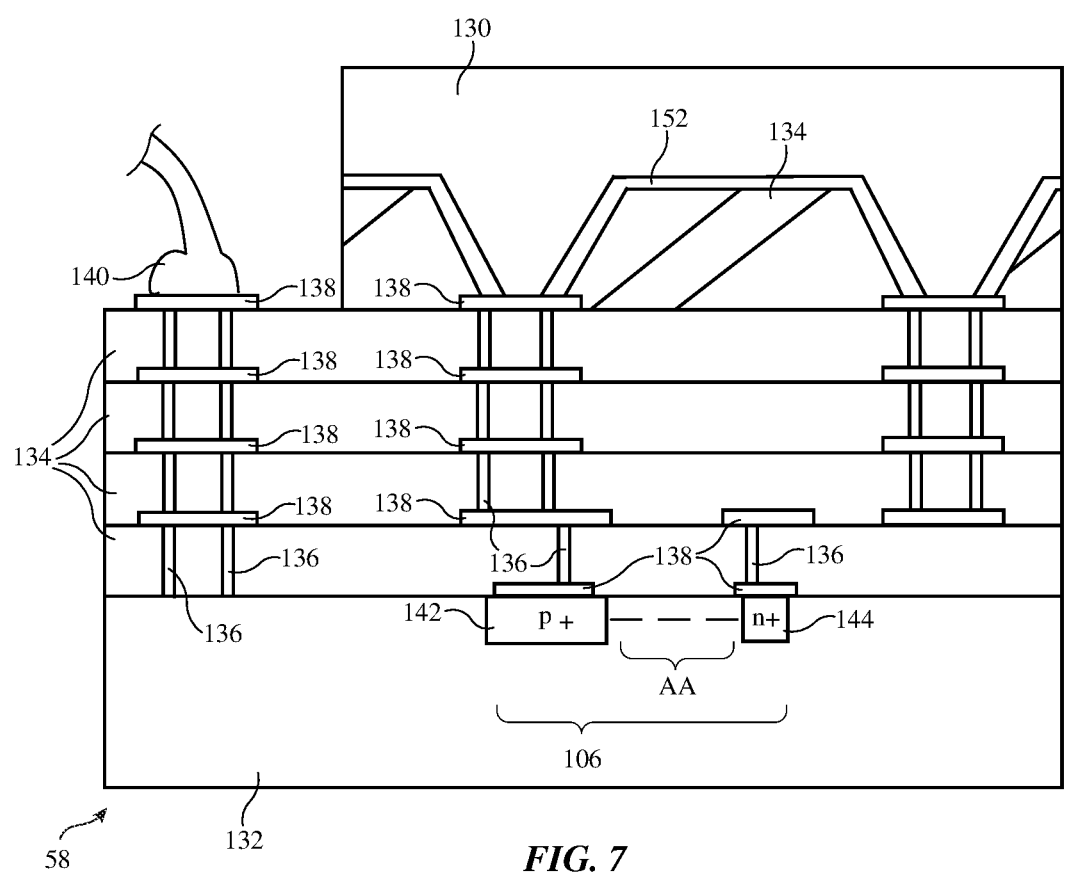
FIG. 7 is a cross-sectional side view of an illustrative light detector integrated circuit with shielding in accordance with an embodiment.

In some configurations, electrostatic shielding may be provided using a transparent conductive layer that overlaps photodetectors 106. Consider, as an example, the cross-sectional side view of illustrative light detector integrated circuit 58 that is shown in FIG. 7. As shown in FIG. 7, light detector integrated circuit 58 may include a semiconductor substrate such as substrate 132. Substrate 132 may be formed from silicon or other semiconductor material. Photodetectors 106 may be formed from photodiodes in substrate 132. As shown in FIG. 7, each photodetector 106 may include first terminal such as anode 142 and a second terminal such as cathode 144. With one illustrative configuration, substrate 132 is a p-type substrate, cathode 144 is an n+ region, and anode 142 is a p+ region. Dielectric layers 134 (e.g., inorganic dielectric layers such as silicon oxide layers) and dielectric layer 152 (e.g., a silicon nitride layer) may be deposited on top of photodetectors 106. A transparent conductive layer such as a layer of indium tin oxide or other transparent conductive material may overlap dielectric layer 152, as shown by shielding layer (shield) 130. The presence of shield 130 may help prevent perturbations to the signals produced by photodetector 106 during operation (e.g., noise from a user's finger or other source of static charge may be blocked).

Signal lines in light detector integrated circuit 58 may be formed from patterned metal traces in layers 134 such as vias 136 and metal pads 138. As shown on the left-hand side of FIG. 7, for example, a contact pad for bonding wire 140 may be formed from a stack of metal pads 138. Metal pads 138, vias 136, and other metal traces in dielectric layers 134 may also be used to form an electrical path that shorts anode 142 to shield layer 130 and to a fixed potential such as ground 50 (FIG. 5) and may be used to form an electrical path that couples cathode 144 to the input of integrating analog-to-digital converter 30AD (FIG. 5).

Figure 8:
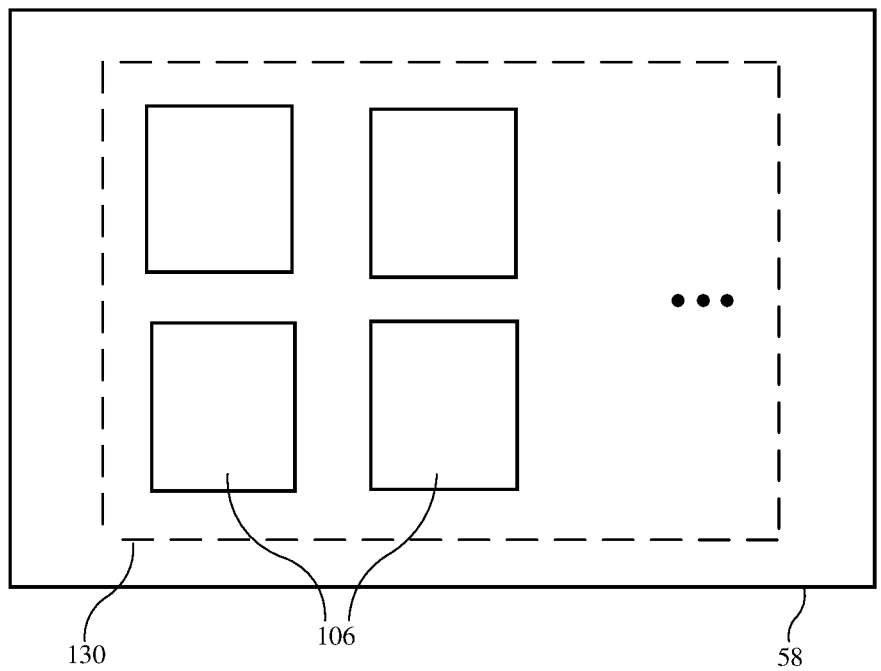
FIG. 8 is a top view of an illustrative light detector integrated circuit with shielding in accordance with an embodiment.

FIG. 8 is a top view of light detector integrated circuit 58 showing how shield 130 may overlap and shield multiple photodetectors 106 on light detector integrated circuit. Each photodetector 106 may be overlapped by a respective color filter. Each color filter may be formed from colored ink or other material that selectively passes a desired range of wavelengths to an associated overlapped photodetector 106 (e.g., an organic color filter material such as polymer containing dyes and/or pigments). For example, a red-pass color filter may overlap a first photodetector 106 to form a red-light-sensing channel in ambient light sensor 30, a blue-pass color filter may overlap a second photodetector 106 to form a blue-light-sensing channel in ambient light sensor 30, etc. If desired, one or more of photodetectors 106 may have no overlapping color filter (e.g., these photodetectors may be associated with clear or "all color" channels). Stray infrared light may be blocked using a thin-film interference filter in layers 126. The thin-film interference filter may be formed from a stack of dielectric layers (e.g., alternating higher and lower refractive index thin-film inorganic layers). An infrared blocking filter may be formed from any suitable number of dielectric layers (e.g., at least 5, at least 10, at least 20, 20-80, fewer than 100, etc.). Color filters and infrared blocking filters may be formed above and/or below shield 130.

In addition to using shields such as shield 92 and/or shield 130, electronic device 10 can use signal processing techniques to help reduce the likelihood of adjusting display brightness for display 14 or taking other action based on potentially noisy information from ambient light sensor 30.

With a first illustrative arrangement, ambient light sensor readings from sensor 30 are averaged over time. A median filter or other filter may be used to discard or otherwise deemphasize or ignore ambient light sensor output spikes, thereby reducing the likelihood that a noisy signal will cause a fluctuation in display brightness.

With a second illustrative arrangement, an optical or capacitive proximity sensor (see, e.g., components 18, photodetectors 106 in sensor 30, etc.) or other sensor may be configured to detect the presence of user's finger 80 in the vicinity of optical window 40 (e.g., adjacent to ambient light sensor 30). When the user's finger or other object whose presence may perturb the output of the ambient light sensor is detected, corresponding ambient light sensor readings can be discarded.

With a third illustrative arrangement, control circuitry 16 can compare a clear (not-colored) channel in the photodetectors 106 of ambient light sensor 30 to a channel of a particular color (e.g., blue). The clear channel has an uncolored (clear) photodetector 106 and therefore receives visible light of all visible wavelengths with this photodetector. The channel of the particular color (blue in this example), receives only blue light. In normal usage, when finger 80 is not present, the output of the clear channel, which receives light for all colors, will be larger than the output for the blue channel. In response to static charge on a user's finger 80 that is capacitively coupled to ambient light sensor 30, both the clear channel output and the blue channel output will be equally affected. Control circuitry 16 can use the ratio of the blue output to clear output to determine whether a given signal is noise or is a valid ambient light signal. If the ratio of clear to blue is high (e.g., above a predetermined threshold ratio of at least 1, at least 1.5, at least 2, at least 5, at least 25, etc.), the signal can be trusted as corresponding to an ambient light reading. If the ratio of clear to blue is low (e.g., at or below unity), noise is likely present and the reading can be discarded. Techniques such as these can be used in an electronic device that incorporates shield 92 and/or that incorporates shield 130.

The foregoing is merely illustrative and various modifications can be made to the described embodiments. The foregoing embodiments may be implemented individually or in any combination.

What is claimed is:
1. An electronic device, comprising:
a transparent member having an optical component window;
a support structure having a surface facing the transparent member;
a light detector integrated circuit coupled to the support structure;
an electrostatic shield layer on the surface that is configured to shield the light detector; and
optical components in the support structure between the light detector and the transparent member.

2. The electronic device defined in claim 1 further comprising a signal path that is configured to short the electrostatic shield layer to a fixed potential.

3. The electronic device defined in claim 2 wherein the optical components comprise a light diffuser.

4. The electronic device defined in claim 3 wherein the optical components comprise a visible-light-transmitting-and-infrared-light-blocking filter.

5. The electronic device defined in claim 4 wherein the optical components comprise a light guide interposed between the light diffuser and the visible-light-transmitting-and-infrared-light-blocking filter.

6. The electronic device defined in claim 2 wherein the support structure comprises a plastic support having an interior in which the optical components are mounted and having an exterior surface on which the signal path is formed.

7. The electronic device defined in claim 2 wherein the light detector integrated circuit comprises a plurality of photodetectors overlapped by respective color filters of different colors.

8. The electronic device defined in claim 7 further comprising:
a display having a brightness; and
control circuitry configured to adjust the brightness based on information from the light detector integrated circuit.

9. The electronic device defined in claim 8 wherein the photodetectors include photodetectors corresponding to a clear channel and to a channel of a given color and wherein the control circuitry is configured to adjust the brightness at least partly in response to a ratio of an output from the clear channel to an output from the channel of the given color.

10. The electronic device defined in claim 1 wherein the light detector integrated circuit includes photodetectors and wherein the light detector integrated circuit further comprises an additional electrostatic shield layer covering the photodetectors.

11. The electronic device defined in claim 10 wherein the additional electrostatic shield layer comprises a layer of transparent conductive material.

12. The electronic device defined in claim 11 further comprising a signal path configured to short the layer of transparent conductive material to a fixed potential.

13. An electronic device, comprising:
an array of pixels configured to display images;
a display cover layer that overlaps the pixels;
an optical component window in a portion of the display cover layer through which ambient light passes; and
a color ambient light sensor aligned with the optical component window, wherein the color ambient light sensor includes:
an opaque support structure;
a light detector integrated circuit that is at least partially surrounded by the opaque support structure, wherein the light detector integrated circuit has a plurality of photodetectors each overlapped by a color filter that is configured to pass a different respective band of visible light wavelengths; and
an electrostatic shield configured to shield the light detector integrated circuit from signal perturbations.

14. The electronic device defined in claim 13 wherein the opaque support structure has a surface facing the display cover layer and wherein the electrostatic shield comprises a metal layer on the surface that is shorted to a fixed potential.

15. The electronic device defined in claim 14 further comprising a layer of adhesive interposed between the surface and the display cover layer.

16. The electronic device defined in claim 13 wherein the electrostatic shield comprises a transparent conductive layer on the light detector integrated circuit that overlaps the photodiodes and is shorted to a fixed potential.

17. The electronic device defined in claim 16 wherein the opaque support structure has a surface facing the display cover layer and wherein the electronic device further comprises a metal layer on the surface that is shorted to the fixed potential.

18. The electronic device defined in claim 13 further comprising:
a flexible printed circuit with metal traces;
a signal path on the support structure that shorts the electrostatic shield to a trace at a fixed potential in the metal traces.

19. An electronic device, comprising:
a display having a display cover layer;
an ambient light sensor window in the display cover layer; and
an ambient light sensor configured to receive ambient light through the ambient light sensor window, wherein the ambient light sensor comprises:
a light detector; and
a ring of metal at a fixed potential that surrounds the ambient light sensor window and that faces an inner surface of the display cover layer, wherein the ring of metal is configured to serve as an electrostatic shield for the light detector.

20. The electronic device defined in claim 19 wherein the light detector comprises:
a plurality of photodetectors; and
a layer of transparent conductive material at the fixed potential that overlaps the photodetectors.

* * * * *